United States Patent
Park et al.

(10) Patent No.: US 9,678,371 B2
(45) Date of Patent: Jun. 13, 2017

(54) DISPLAY WITH DELAY COMPENSATION TO PREVENT BLOCK DIMMING

(71) Applicant: Apple Inc., Cupertino, CA (US)

(72) Inventors: Kwang Soon Park, Cupertino, CA (US); Chun-Yao Huang, Cupertino, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 164 days.

(21) Appl. No.: 14/727,721

(22) Filed: Jun. 1, 2015

(65) Prior Publication Data
US 2016/0351105 A1    Dec. 1, 2016

(51) Int. Cl.
*G02F 1/13*    (2006.01)
*G09G 3/36*    (2006.01)
*G11C 19/00*    (2006.01)

(52) U.S. Cl.
CPC ............. *G02F 1/13* (2013.01); *G09G 3/3648* (2013.01); *G09G 3/3677* (2013.01); *G11C 19/00* (2013.01); *G09G 3/3666* (2013.01); *G09G 2300/043* (2013.01); *G09G 2300/0408* (2013.01); *G09G 2300/08* (2013.01); *G09G 2310/0286* (2013.01); *G09G 2320/0223* (2013.01); *G09G 2320/0233* (2013.01)

(58) Field of Classification Search
CPC ....... G09G 2300/0408; G09G 2300/08; G09G 2320/0626; G09G 3/2092
USPC .......................................................... 345/87
See application file for complete search history.

(56) References Cited

U.S. PATENT DOCUMENTS

| 7,502,020 | B2 * | 3/2009 | Kim ................. | G09G 3/3655 345/211 |
| 8,089,598 | B2 | 1/2012 | Kim et al. | |
| 8,125,478 | B2 * | 2/2012 | Lin ................... | G09G 3/3696 345/212 |
| 8,907,991 | B2 | 12/2014 | Jaffari et al. | |
| 2001/0022568 | A1 * | 9/2001 | Kang ................ | G09G 3/006 345/87 |
| 2002/0051110 | A1 * | 5/2002 | Kim ................... | G02F 1/1345 349/149 |
| 2002/0084968 | A1 * | 7/2002 | Park .................. | G09G 3/3648 345/92 |
| 2004/0145552 | A1 * | 7/2004 | Song ................. | G02F 1/13452 345/87 |
| 2006/0159217 | A1 * | 7/2006 | Harada .............. | G11C 19/00 377/64 |

(Continued)

*Primary Examiner* — Tony Davis
(74) *Attorney, Agent, or Firm* — Treyz Law Group, P.C.; G. Victor Treyz; Jason Tsai (57) ABSTRACT

A display may have an array of pixels controlled by display driver circuitry. The display driver circuitry may supply the pixels with data signals over data lines in columns of the pixels and may supply the pixels with gate line signals over gate lines in rows of the pixels. The display driver circuitry may have a display driver integrated circuit located on one of the edges of the display. The display driver circuitry may also have gate driver integrated circuits that extend along opposing edges of the display to form a pair of shift registers. Conductive lines in a display substrate may be coupled to opposing ends of the shift registers and to intermediate locations within the shift registers to minimize delays in distributing a gate high voltage signal from the display driver integrated circuit to the shift registers.

20 Claims, 7 Drawing Sheets

(56) References Cited

U.S. PATENT DOCUMENTS

2012/0098807 A1* 4/2012 Lee ................ H03K 19/018507
                                                        345/209
2013/0063404 A1   3/2013 Jamshidi Roudbari et al.
2013/0321253 A1  12/2013 Park et al.
2014/0239317 A1*  8/2014 Bang ...................... H05K 1/147
                                                         257/88
2015/0109357 A1   4/2015 Nakai et al.

* cited by examiner

DISPLAY WITH DELAY COMPENSATION TO PREVENT BLOCK DIMMING

BACKGROUND

This relates generally to electronic devices, and, more particularly, to electronic devices with displays.

Electronic devices such as cellular telephones, computers, and other electronic devices often contain displays. A display includes an array of pixels for displaying images to a user. Display driver circuitry such as source line driver circuitry may supply data signals to the array of pixels. Gate line driver circuitry in the display driver circuitry can be used to assert a gate line signal on each row of pixels in the display in sequence to load data into the pixels.

The gate line driver circuitry in a display may be implemented using gate line driver integrated circuits that are mounted along the edges of a display substrate. Signal lines on the substrate may be used to distribute signals to the gate driver circuitry from a display driver integrated circuit such as a timing controller integrated circuit. Signal lines may also pass through the gate driver integrated circuits to distribute signals from a display driver integrated circuit.

Capacitive loading effects may create delays in distributing signals from the display driver integrated circuit to the gate driver integrated circuits. If care is not taken, this can lead to undesired visible artifacts on a display. For example blocks of pixels that are controlled using different gate driver integrated circuits may have perceptibly different brightness levels.

It would therefore be desirable to be able to provide improved displays for electronic devices.

SUMMARY

A display may have an array of pixels controlled by display driver circuitry. The display driver circuitry may supply the pixels with data signals over data lines in columns of the pixels and may supply the pixels with gate line signals over gate lines in rows of the pixels.

The display driver circuitry may have a display driver integrated circuit located on one of the edges of the display. The display driver circuitry may also have gate driver integrated circuits that are couple in series along opposing edges of the display to form a pair of shift registers. The shift registers may supply the gate line signals to the gate lines.

The pixels may be formed on a substrate. Lines on the substrate may be coupled to pads in the gate driver integrated circuits and may be used in distributing a voltage signal such as a gate high voltage from the display driver integrated circuit to the shift registers for use in creating the gate line signals. Supplemental conductive segments on the substrate may be coupled to opposing ends of the shift registers and to intermediate locations within the shift registers to minimize delays in distributing the voltage signal from the display driver integrated circuit. The supplemental conductive segments may include conductive traces that run parallel to the gate driver integrated circuits without being overlapped by any of the gate driver integrated circuits.

DETAILED DESCRIPTION

Figure 1:
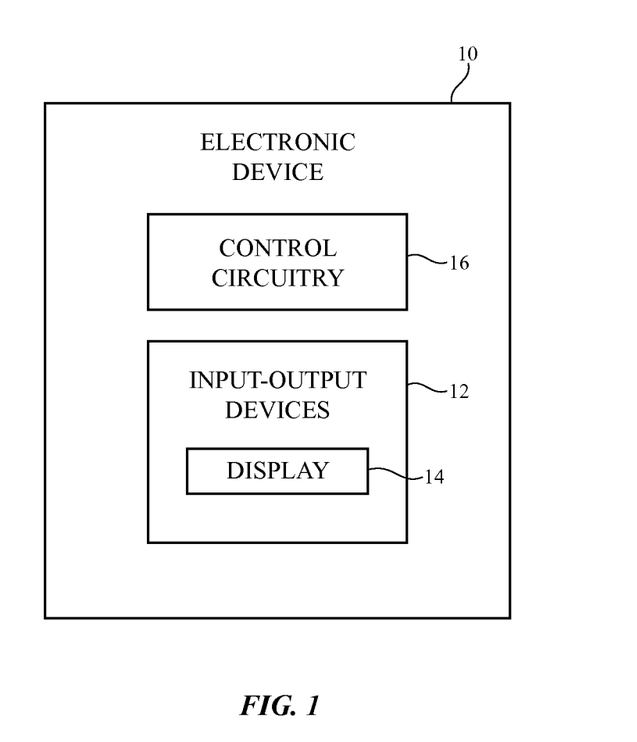
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a monitor that includes an embedded computer, a monitor that does not include an embedded computer, a display for use with a computer or other equipment that is external to the display, a cellular telephone, a media player, a wristwatch device or other wearable electronic equipment, or other suitable electronic device.

Display 14 may be an organic light-emitting diode display, a liquid crystal display, an electrophoretic display, an electrowetting display, a display based on an array of discrete crystalline light-emitting diode dies, or a display based on other types of display technology. Configurations in which display 14 is a liquid crystal display may sometimes be described herein as an example.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
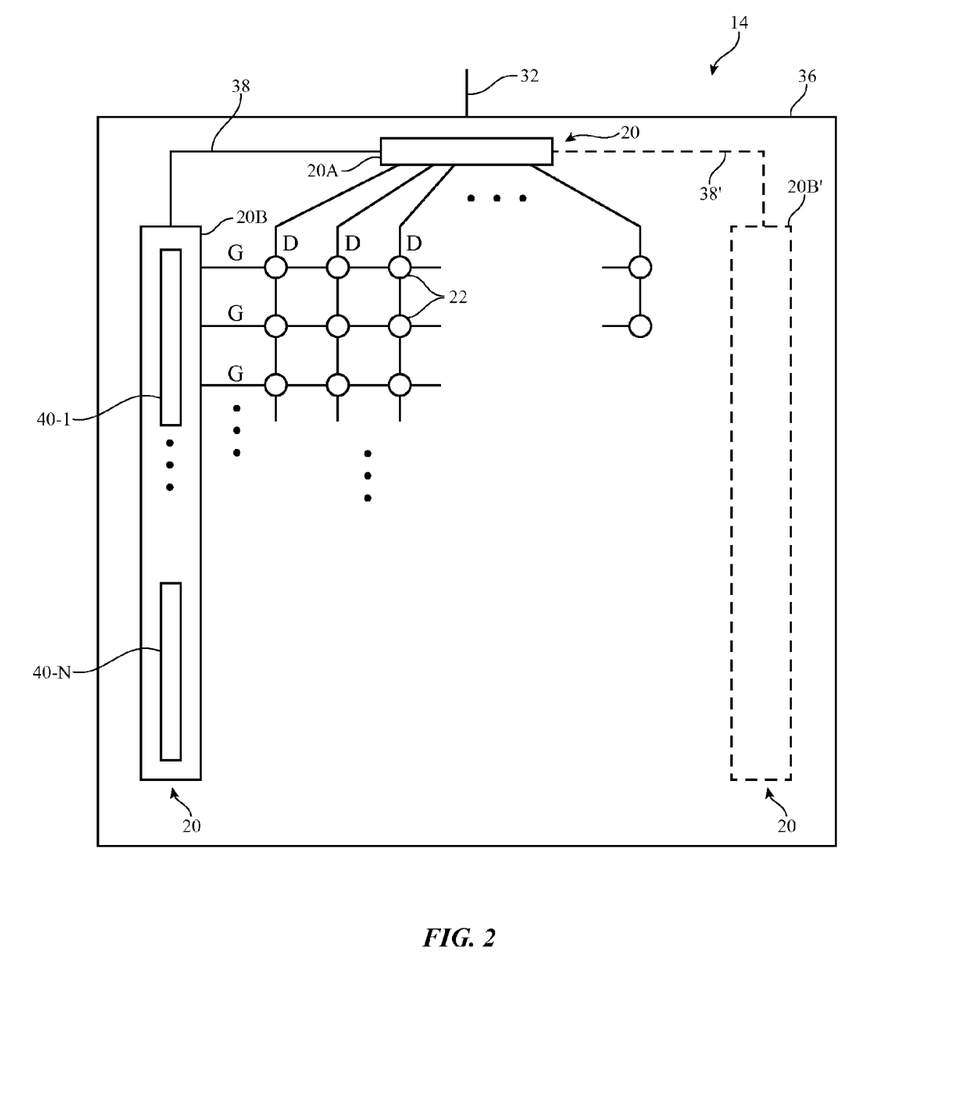
FIG. 2 is a top view of an illustrative display in an electronic device in accordance with an embodiment.

A top view of a portion of display 14 is shown in FIG. 2. As shown in FIG. 2, display 14 may have an array of pixels 22 formed from substrate structures such as substrate 36. Substrates such as substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). In organic light-emitting diode displays, pixels 22 contain respective light-emitting diodes and pixel circuits that control the application of current to the light-emitting diodes. In liquid crystal displays, pixels 22 contain pixel circuits that control the application of signals to pixel electrodes that are used for applying controlled amounts of electric field to pixel-sized portions of a liquid crystal layer. The pixel circuits in pixels 22 may contain transistors having gates that are controlled by gate line signals on gate lines G.

Display driver circuitry 20 may be used to control the operation of pixels 22. Display driver circuitry 20 may be formed from integrated circuits, thin-film transistor circuits, or other suitable circuitry. Thin-film transistor circuitry may be formed from polysilicon thin-film transistors, semiconducting-oxide thin-film transistors such as indium gallium zinc oxide transistors, or thin-film transistors formed from other semiconductors. Pixels 22 may have color filter elements or other colored structures of different colors (e.g., red, green, and blue) to provide display 14 with the ability to display color images.

Display driver circuitry 20 may include display driver circuits such as display driver circuit 20A and gate driver circuitry 20B. Display driver circuit 20A may be formed from one or more display driver integrated circuits and/or thin-film transistor circuitry (e.g., timing controller integrated circuits). Gate driver circuitry 20B may be formed from gate driver integrated circuits or may be thin-film "gate-on-array" circuitry. Display driver circuit 20A of FIG. 2 may contain communications circuitry for communicating with system control circuitry such as control circuitry 16 of FIG. 1 over path 32. Path 32 may be formed from traces on a flexible printed circuit or other conductive lines. During operation, the control circuitry (e.g., control circuitry 16 of FIG. 1) may supply circuit 20A with information on images to be displayed on display 14.

To display the images on display pixels 22, display driver circuitry 20A may supply image data to data lines D while issuing control signals to supporting display driver circuitry such as gate driver circuitry 20B over path 38. Path 38 may, for example, include lines for carrying power signals such as a gate high voltage signal Vgh (which can serve as a maximum gate line signal value output from the gate driver circuitry onto each gate line) and a gate low voltage signal Vgl (which can serve as a ground), control signals such as gate output enable signals, etc. Circuitry 20A may supply these signals to gate driver circuitry 20B on one or both edges of display 14 (see, e.g., path 38' and gate driver circuitry 20B' on the right-hand side of display 14 in the example of FIG. 2).

Gate driver circuitry 20B (sometimes referred to as horizontal control line control circuitry) may control horizontal control lines (gate lines) G using the signals received from path 38 (e.g., using the gate high voltage, gate low voltage, gate output enable signals, etc.). Gate lines G in display 14 may each carry a gate line signal for controlling the pixels 22 of a respective row (e.g., to turn on transistors in pixels 22 when loading data from the data lines into pixel storage capacitors in those pixels from data lines D). During operation, frames of image data may be displayed by asserting a gate signal on each gate line G in the display in sequence. Shift register circuitry (e.g., a chain of registers) in gate driver circuitry 20B may be used in controlling the gate line signals.

Multiple integrated circuits such as illustrative gate driver integrated circuits 40-1 . . . 40-N of FIG. 2 may be used in supplying gate signals G. Registers in each gate driver integrated circuit may be connected in a chain to form a shift register for that gate driver integrated circuit. The output of the last register in the shift register of each gate driver integrated circuit may be coupled to the input of the next gate driver integrated circuit in circuitry 20B to form a shift register that spans all of the gate lines in display 14. In arrangements in which there are gate driver circuits on both sides of display 14, the shift register circuitry of the left gate driver circuitry may be using in supplying gate line signals to odd rows of pixels 22 whereas the shift register circuitry of the right gate driver circuitry may be used in supplying gate line signals to even rows of pixels 22 (as an example).

Figure 3:
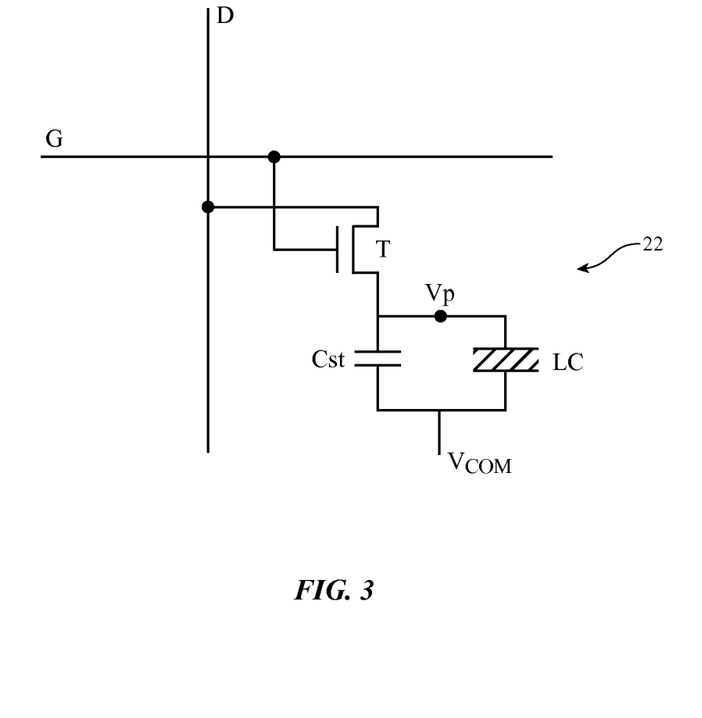
FIG. 3 is a circuit diagram of an illustrative pixel circuit in a display in accordance with an embodiment.

An illustrative pixel circuit for pixels 22 of display 14 is shown in FIG. 3. As shown in FIG. 3, each pixel 22 may include a pixel-sized portion of a liquid crystal layer LC to which electric fields may be supplied using corresponding pixel electrodes. The magnitude of the applied field is proportional to pixel voltage Vp minus common electrode voltage Vcom. During data loading operations, a desired data line signal (i.e., a data voltage Vp that is to be loaded into pixel 22) is driven onto data line D. The gate line signal on gate line G is asserted while the data line signal on data line D is valid. When the gate line signal is asserted, the gate of transistor T is taken high and transistor T is turned on. With transistor T turned on, data from line D is driven onto storage capacitor Cst and establishes pixel voltage Vp. Storage capacitor Cst maintains the value of Vp between successive image frames.

Figure 4:
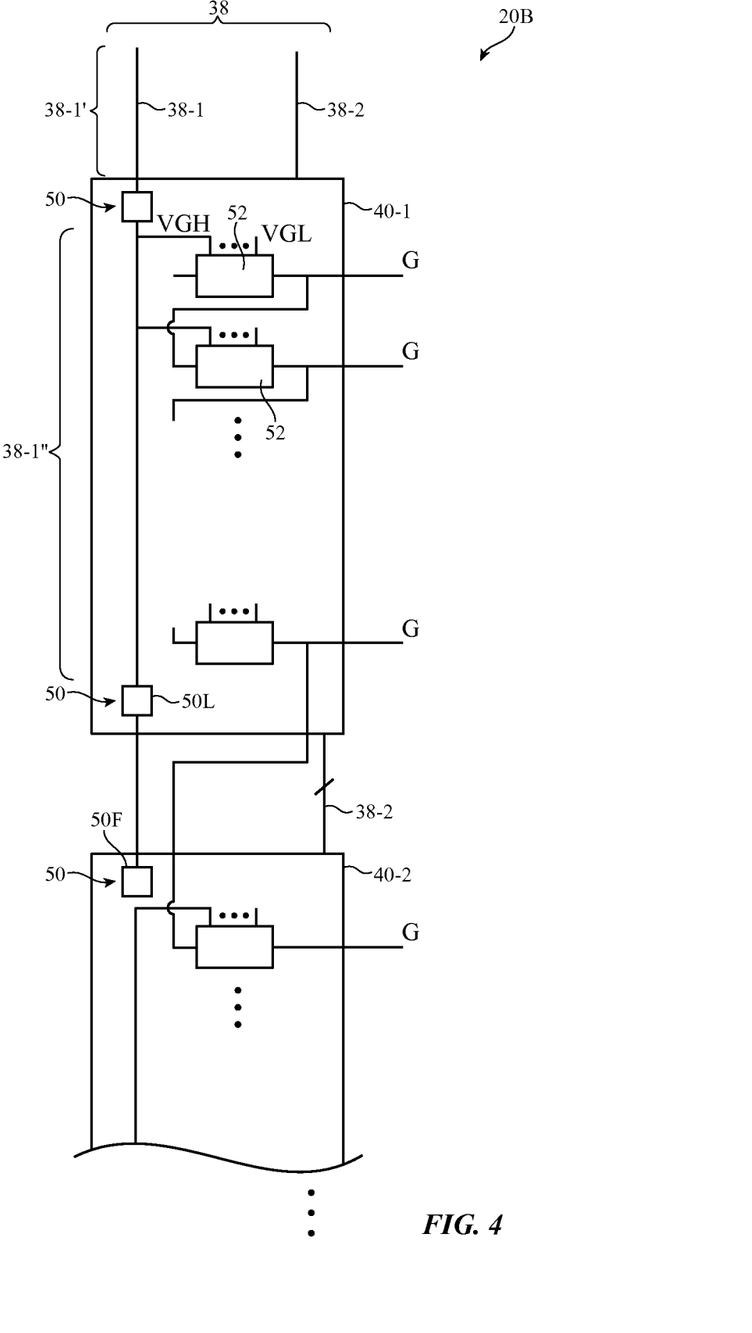
FIG. 4 is diagram of illustrative gate driver circuitry in accordance with an embodiment.

FIG. 4 is a circuit diagram of a portion of illustrative gate driver circuitry 20B containing multiple gate driver integrated circuits (40-1, 40-2 . . . ). Signals may be provided to integrated circuits 40-1, 40-2, . . . from circuitry 20A using signal lines in path 38 such as signal line 38-1 and signal line 38-2. The signals on lines 38 may include a gate high voltage Vgh, a gate low voltage Vgl, a gate enable signal, and/or other control and power signals for operating the circuits of circuitry 20B. Signal paths may be routed alongside the gate driver integrated circuits on substrate 36 (FIG. 2), may pass through internal lines in the gate driver integrated circuits, and/or may pass under the gate driver integrated circuits on substrate 36.

Signal line 38-1 may be used to supply gate high voltage Vgh to the gate driver integrated circuits and may have segments such as segment 38-1' that are formed from metal traces or other conductive traces on substrate 36 (FIG. 2) and segments such as segment 38-1" that are formed from metal traces within the gate driver integrated circuits. Signal line segments such as segment 38-1' may sometimes be referred to as line-on-glass (LOG) segments and may be formed from metal traces such as copper traces or traces of other metals.

Segments such as segment 38-1" may sometimes be referred to as integrated circuit segments or internal line segments. Integrated circuit line segments such as segment 38-1" may be coupled to integrated circuit bond pads (contacts) such as pads 50 in the gate driver integrated circuits. Solder or conductive adhesive under pads 50 may then be used to couple the integrated circuit line segments to corresponding contact pads formed from portions of the line-on-glass segments. If desired, there may be line-on-glass segments that run parallel to integrated circuit segments 38-1" on the portions of the substrate under the gate driver integrated circuits (e.g., to help reduce path resistance).

As shown in FIG. 4, gate line driver circuitry 20B may contain a shift register formed from a chain of registers 52. Registers 52 are coupled in series, so that the output of each register serves as the trigger input to a subsequent register in the shift register. The trigger signal for the first register 52 may be received from display driver circuitry 20B over one of paths 38 (e.g., one of paths 38-2). The output of each register 52 may, if desired, be strengthened by a corresponding gate line buffer. Each register produces a gate line signal for a respective one of gate lines G. The gate lines signals (sometimes referred to as gate line pulses) are asserted in sequence so that data can be loaded into each of the rows of pixels 22 in display 14.

The circuitry of pixels 22 may contain parasitic capacitances. For example, there may be parasitic capacitances between the gate of transistor T of FIG. 3 and the source and drain of transistor T. During data loading into pixels 22, a data signal is placed on data lines D. A gate line signal is then asserted on gate line G to load the data signal into pixels 22 (e.g., to establish pixel voltage Vp of FIG. 3). Parasitic capacitance (e.g., gate-source capacitance Cgs in transistor T) is present in pixels 22. When the gate signal is deasserted, a voltage drop Vkb (sometimes referred to as a kickback voltage) can be imparted to pixel voltage Vp. The magnitude of Vkb may be given by equation 1.

$$Vkb = Cgs(V_{GH} - V_{GL})/Ctot \qquad (1)$$

In equation 1, Vkb is the kickback voltage, Cgs is the gate-source capacitance coupled between gate line G and the pixel node associated with voltage Vp, $V_{GH}$ is the gate high voltage from circuit 20A, $V_{GL}$ is the gate low voltage from circuit 20A, and Ctot is equal to the sum of $C_{LC}$ (the capacitance of liquid crystal region LC of pixel 22 of FIG. 3), storage capacitance Cst, and Cgs.

If voltage Vkb is uniform across display 14, the brightness of pixels 22 will be uniform. If, however, there is a noticeable change ΔVkb in voltage Vkb between regions of the display, the brightness of pixels 22 in those regions may be visibly different, giving rise to undesired visible artifacts on display 14. It would therefore be desirable to ensure that ΔVkb is minimized between all adjacent rows in display 14.

Due to ohmic losses, there is a gradual drop in voltage $V_{GH}$ as a function of increasing row (i.e., increasing distance along line 38-1 from the source of $V_{GH}$ in circuit 20A). Gradual drops of the type that may occur between successive rows within a given gate driver integrated circuit will not generally result in significant ΔVkb values. At the boundary between gate driver integrated circuits, however, there is potential for manufacturing variations to give rise to undesired high resistances for line-on-glass segments such as segment 38-1' of FIG. 4. During operation, signal delay in $V_{GH}$ due to RC loading effects on path 38-1 can give rise to a voltage difference $\Delta V_{GH}$ across a high-resistance line-on-glass segment between respective gate driver circuits. The voltage difference $\Delta V_{GH}$ may produce a difference in kickback voltage ΔVkb between the gate lines associated with the respective gate driver integrated circuits in accordance with equation 2.

$$\Delta Vkb = Cgs \Delta V_{GH}/Ctot \qquad (2)$$

As a result, there may be a notable brightness difference between the region of display 14 that is associated with the gate lines driven by one gate driver integrated circuit (e.g., gate driver integrated circuit 40-1 of FIG. 4) and the region of display 14 that is associated with the gate lines driven by the adjacent gate driver integrated circuit (e.g., gate driver integrated circuit 40-2). The signal delay associated with distributing voltage $V_{GH}$ (RC delay) imparts a voltage difference $\Delta V_{GH}$ between the $V_{GH}$ output terminal of gate driver integrated circuit 40-1 (i.e., output terminal 50L of FIG. 4) and the $V_{GH}$ input terminal of subsequent gate driver integrated circuit 40-2 (i.e., input terminal 50F of FIG. 4). As shown in equation 2, this can lead to an undesired variation in kickback voltage ΔVkb and therefore a noticeable change in pixel brightness across the boundary between the last gate line associated with circuit 40-1 and the first gate line associated with circuit 40-2 (in the present example).

To minimize or eliminate noticeable pixel brightness changes, supplemental line-on-glass segments for $V_{GH}$ line 38-1 may be added to gate driver circuitry 20B. The supplemental line-on-glass segments may be formed from strips of metal (e.g., copper lines) on substrates such as substrate 36 of display 14 that are characterized by negligible capacitance values and low resistances (e.g., 100-200 ohms). The supplemental line-on-glass segments may therefore exhibit negligible amounts of RC delay and can be used in effectively driving the same $V_{GH}$ signals onto all of the terminals 50 of gate driver integrate circuits 40-1, 40-2, . . . 40-N. In this way, the value of $\Delta V_{GH}$ across line-on-glass segments 38-1' between pads 50 of adjacent gate driver integrated circuits can be minimized and undesired changes in pixel brightness between the rows of display 14 can be prevented.

Figure 5:
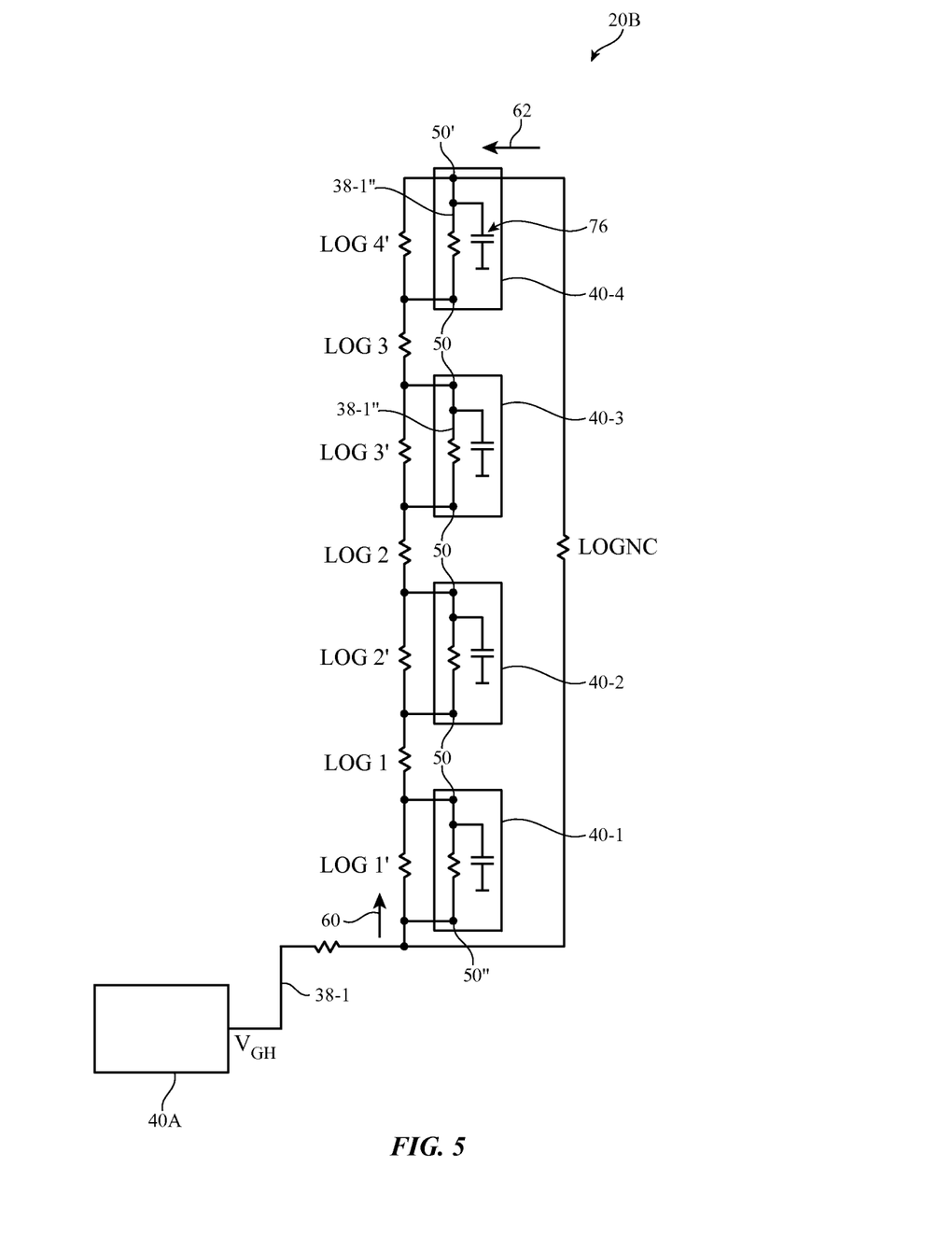
FIGS. 5, 6, and 7 are diagrams showing illustrative gate driver circuitry signal lines that may be formed in a display in accordance with an embodiment.
Figure 6:
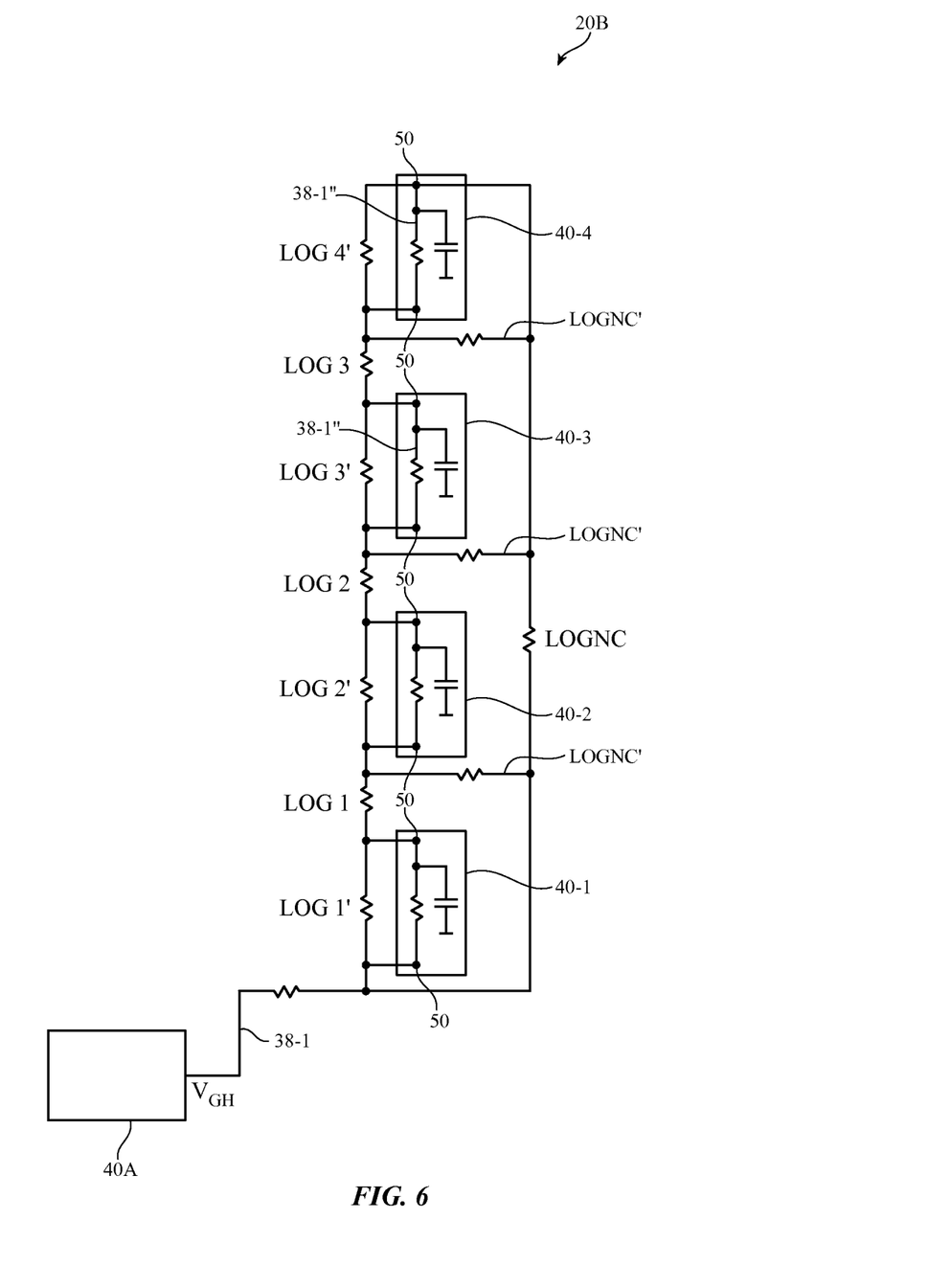
Figure 7:
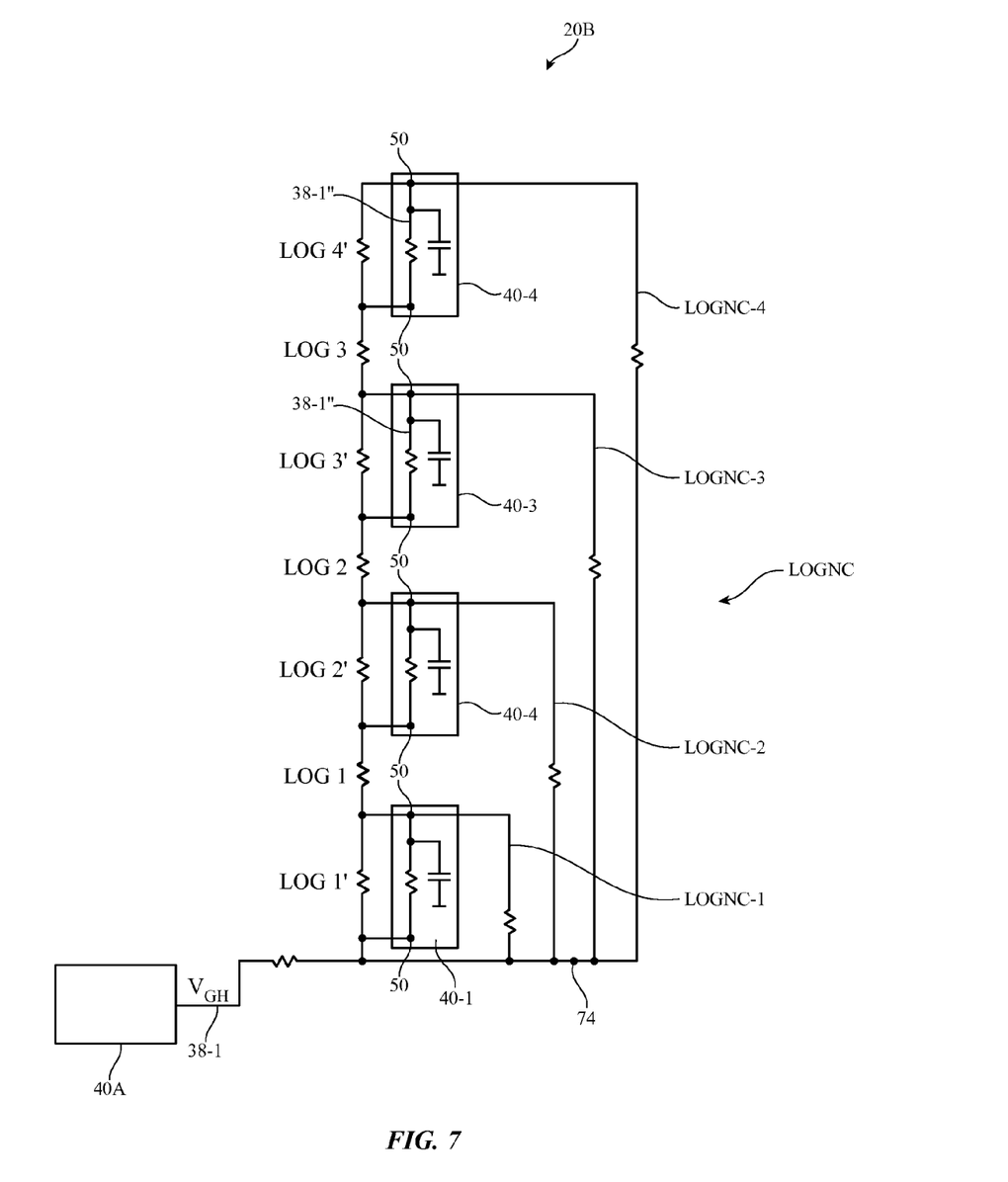

FIGS. 5, 6, and 7 show illustrative designs that may be used to incorporate supplemental line-on-glass segments into gate high voltage signal line 38-1. As shown in FIGS. 5, 6, and 7, gate driver circuitry 20B may include four illustrative gate driver integrated circuits (circuits 50-1, 50-2, 50-3, and 50-4), each having pads 50 at opposing ends of a respective internal $V_{GH}$ signal line segment 38-1". Line-on-glass segment LOG1' extends under circuit 40-1 on substrate 36 and runs in parallel with the internal $V_{GH}$ line of circuit 40-4 (and is coupled to opposing ends of this internal line at pads 50). Similarly, line-on-glass segment LOG2' extends under circuit 40-2, line-on-glass segment LOG3' extends under circuit 40-3, and line-on-glass segment LOG4' extends under circuit 40-4. A line-on-glass segment such as segment 38-1' of FIG. 4 extends between the output of each gate driver integrated circuit and the input of the next gate driver circuit (see, for example, connecting line-on-glass segments LOG1, LOG2, and LOG3).

Supplemental line-on-glass segments for $V_{GH}$ line 38-1 may help drive signal $V_{GH}$ onto the terminals 50 of the gate driver integrated circuits with minimal RC delay. In the example of FIG. 5, path 38-1 has been provided with a supplemental line-on-glass line such as line LOGNC that runs parallel with circuits 40-1, 40-2, 40-3, and 40-4 (without being overlapped by circuits 40-1, 40-2, 40-3, and 40-4) and drives $V_{GH}$ signals from circuit 40A onto node 50' of circuit 40-4. In this way, $V_{GH}$ is simultaneously driven onto node 50" in direction 60 and onto node 50' in direction 62. This minimizes loading effects associated with path 38-1 and reduces RC delay when providing $V_{GH}$ to terminals 50 throughout the shift register of circuitry 20B.

In the illustrative configuration of FIG. 6, intermediate supplemental line-on-glass segments LOGNC' branch off of supplemental path LOGNC and different respective locations and couple supplemental line LOGNC to respective pads 50 to help further minimize loading and RC delay on the $V_{GH}$ signal.

In the illustrative configuration of FIG. 7, there are four supplemental line-on-glass lines (LOGNC-1, LOGNC-2, LOGNC-3, and LOGNC-4), each of which is coupled between node 74 at the output of circuit 40A (i.e., at one of the two ends of the shift register circuitry of circuit 20B) and a respective gate driver integrated circuit pad 50 within the shift register circuitry. Other patterns of supplemental signal paths for distributing signals such as gate high voltage $V_{GH}$ may be used if desired. The configurations of FIGS. 5, 6, and 7 are merely illustrative.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   a substrate;
   an array of pixels on the substrate, wherein the array has first and second opposing edges and has third and fourth opposing edges; and
   display driver circuitry that provides data signals to the pixels over data lines and that provides gate lines signals to the array of pixels over gate lines, wherein the display driver circuitry includes gate driver circuitry that runs along at least the third edge and includes at least one display driver integrated circuit along the first edge, wherein the gate driver circuitry includes a series of gate driver integrated circuits that extend along the third edge and that are coupled together in series to form shift register circuitry, and wherein each of the gate driver integrated circuits has opposing first and second pads and an internal line segment coupled between the first and second pads; and
   a plurality of conductive trace segments on the substrate each of which is coupled between the first pad of one of the gate driver integrated circuits and the second pad of another of the gate driver integrated circuits;
   at least one supplemental conductive trace segment that runs parallel to the plurality of gate driver integrated circuits and that is coupled between one of the first pads and one of the second pads, wherein the display driver integrated circuit provides a gate high voltage to the gate driver circuitry using the plurality of conductive trace segments, the internal line segments, and the supplemental conductive trace segment.

2. The display defined in claim 1 further comprising an additional supplemental conductive trace segment on the substrate with which the display driver integrated circuit provides the gate high voltage to the gate driver circuitry.

3. The display defined in claim 2 wherein the additional supplemental conductive trace segment extends between the supplemental conductive trace segment and a given one of the first and second pads and wherein the given one of the first and second pads is located between an adjacent pair of the gate driver integrated circuits.

4. The display defined in claim 3 wherein the additional supplemental conductive trace segment is one of a plurality of additional supplemental conductive trace segments each of which branches off of the supplemental conductive traces segment at a different respective location.

5. The display defined in claim 4 wherein each of the plurality of additional supplemental conductive trace segments has a first end coupled to the supplemental conductive trace segment and an opposing second end coupled to a respective one of the first and second pads.

6. The display defined in claim 5 further comprising a plurality of conductive lines on the substrate, wherein each of the plurality of conductive lines runs under a respective one of the gate driver integrated circuits.

7. The display defined in claim 6 wherein each of the plurality of conductive lines is coupled between the first pad and the second pad of a respective one of the gate driver integrated circuits.

8. The display defined in claim 7 wherein the shift register circuitry includes a plurality of registers each of which supplies a respective one of the gate line signals.

9. The display defined in claim 1 wherein the shift register circuitry has opposing first and second ends and a plurality of registers coupled in series between the first and second ends and wherein the supplemental conductive trace segment has a first end coupled to the first end of the shift register.

10. The display defined in claim 9 wherein the supplemental conductive trace segment has a second end coupled to the second end of the shift register.

11. The display defined in claim 10 wherein the supplemental conductive trace segment is one of a plurality of supplemental conductive trace segments each having opposing first and second ends, wherein the first end of each of the supplemental conductive trace segments is coupled to the first end of the shift register.

12. The display defined in claim 11 wherein the substrate comprises glass and wherein the plurality of supplemental conductive trace segments comprise line-on-glass segments.

13. The display defined in claim 12 wherein the second end of each of the plurality of supplemental conductive trace segments is coupled to a respective one of the pads.

14. A display, comprising:
   a substrate having top and bottom edges and left and right edges;
   a rectangular array of liquid crystal display pixels on the substrate;
   at least one display driver integrated circuit on a selected one of the top and bottom edges;
   gate driver integrated circuits that run along the left and right edges to form respective first and second shift registers each having opposing first and second ends, wherein the at least one display driver integrated circuit supplies data signals to columns of the pixels in the rectangular array, wherein the gate driver integrated circuits supply gate line signals to rows of the pixels on gate lines, and wherein the gate driver integrated circuits each have first and second pads that are coupled using an internal line segment in that gate driver integrated circuit;
   a plurality of conductive trace segments on the substrate each of which is coupled between the first and second pads of a respective one of the gate driver integrated circuits; and
   supplemental conductive trace segments on the substrate including a first supplemental conductive trace segment having a first end coupled to the first end of the first shift register and a second end coupled to the second end of the first shift register, wherein the display driver integrated circuit supplies a gate high voltage to the first ends of the first and second shift registers.

15. The display defined in claim 14 wherein the supplemental conductive trace segments include a second supplemental conductive trace segment having a first end coupled to the first end of the second shift register and a second end coupled to the second end of the second shift register.

16. The display defined in claim 15 wherein the substrate comprises glass and wherein the supplemental conductive trace segments comprise line-on-glass segments.

17. The display defined in claim 16 further comprising a first set of branch supplemental conductive trace segments on the substrate that each branch from a different respective location on the first supplemental conductive trace segment and each couple to a different respective one of the first pads in the gate driver integrated circuits that run along the left edge.

18. The display defined in claim 17 further comprising a second set of branch supplemental conductive trace segments on the substrate that each branch from a different respective location on the second supplemental conductive trace segment and each couple to a different respective one of the first pads in the gate driver integrated circuits that run along the right edge.

19. The display defined in claim 16 wherein the supplemental conductive trace segments comprise a first plurality of additional conductive trace segments on the substrate each of which has a first end coupled to the first end of first shift register and a second plurality of additional conductive trace segments on the substrate each of which has a first end coupled to the first end of the second shift register.

20. A liquid crystal display, comprising:

a glass substrate;

an array of pixels on the glass substrate;

a plurality of gate driver integrated circuits extending along an edge of the array of pixels and forming a shift register having first and second ends;

a display driver integrated circuit that supplies a gate high voltage; and a line-on-glass segment on the glass substrate that extends between the first and second ends of the shift register and that carries the gate high voltage; and an internal line segment in each of the gate driver integrated circuits that carries the gate high voltage.

* * * * *